United States Patent [19]

Owen et al.

[11] 4,356,558

[45] Oct. 26, 1982

[54] OPTIMUM SECOND ORDER DIGITAL FILTER

[75] Inventors: William J. Owen, Littleton; Robert A. Booker, Evergreen, both of Colo.

[73] Assignee: Martin Marietta Corporation, Bethesda, Md.

[21] Appl. No.: 105,489

[22] Filed: Dec. 20, 1979

[51] Int. Cl.³ .............................................. G06F 15/31
[52] U.S. Cl. .................................. 364/724; 328/167; 333/18
[58] Field of Search ....................... 364/724; 328/167; 333/165, 166, 18, 28 R, 167; 375/103; 455/63, 50

[56] References Cited

U.S. PATENT DOCUMENTS

| | | | |
|---|---|---|---|
| 3,619,586 | 11/1971 | Hoff, Jr. et al. | 364/724 |
| 3,914,588 | 10/1975 | Nussbaumer | 364/724 |
| 3,979,701 | 9/1976 | Tomozawa | 333/166 |
| 4,016,410 | 4/1977 | Eggermont | 364/724 |
| 4,149,258 | 4/1979 | Yahata | 364/724 |
| 4,170,758 | 10/1979 | Tamburelli | 364/724 X |

OTHER PUBLICATIONS

Besseyre–"Digital Filter Synthesizing an All–Pass Network Utilizing a Shift Register", IBM Tech. Disc. Bull.–vol. 14, No. 8–Jan. 1972–pp. 2280 & 2281.

Primary Examiner—Joseph F. Ruggiero
Attorney, Agent, or Firm—Sughrue, Mion, Zinn, Macpeak & Seas

[57] ABSTRACT

A second order digital filter utilizing six processor operations, two add instructions, two shift instructions and two store instructions. No multipliers are required. The filter is used as a digital filter in a servo loop having a Z transform of, $G(Z) = 4(1-Z^{-1}) + Z^{-2}$.

5 Claims, 2 Drawing Figures

ZERO LOCATIONS, $v_1$ & $v_2$, AS A FUNCTION OF $k_1$ & $k_2$

OPTIMUM SECOND ORDER DIGITAL FILTER

BACKGROUND OF THE INVENTION

This invention relates to a digital filter and more particularly to a method of digital filter synthesis. Generally, an accepted technique of digital filter synthesis is to apply pulse filter theory utilizing the Z transform and then to determine the required compensating filters. This is easily accomplished by utilizing the by-linear transform $Z = 1 + w/1 - w$. The difficulty with this approach is that the response of the filter lies within a unit circle. Accordingly, the filter derived from such a prior art technique results in a transfer function which is expressed as a product of sums. Therefore, to maintain the proper location of equivalent poles and zeros of the filter, as many as 6 decimal digital accuracy is required. Moreover, five or six multiply instructions are required for each iteration in the filter loop.

One typical use for such a second order filter element is the context of a space navigation device such as space sextant disclosed in U.S. Pat. Nos. 4,082,462 and 4,083,636. In the context of that utilization the filter formed could be represented by:

$$G(Z) = K \frac{(Z \pm a)(Z \pm b)}{(Z \pm c)(Z \pm d)}$$

where: a, b, c, d are five or six-decimal digit constants. These filters have a requirement of processing each six milliseconds. There are four loops which are closed simultaneously and therefore considerable computation time is involved in this technique. Hence, the high speed requirement of digital filters in a space navigation sextant servo loop presents significant data processing requirements and computers to be used.

For example, a computer which is incorporated into one flight model of a navigation instrument disclosed in the above referenced patent utilizes a Litton system 4516 computer incorporating a 16-bit word, double precision and floating point operation. That computer has machine operating speeds in the order of 1.2 $\mu$sec. Hence, a significant cost penalty is incurred utilizing prior art filter implementation for floating point instruction in the context of a servo loop.

Accordingly, the requirement exists to improve a filter algorithm which eliminates multiplication instructions and can be implemented by reducing real-time requirements of a computational subsystem. The elimination of multipliers allows the use of efficient, low cost microprocessors.

Within the prior art a significant body of patent literature exists which is generally directed to digital filter techniques. Typical, are the filters described in the following United States patents.

U.S. Pat. No. 3,665,171—Morrow
U.S. Pat. No. 3,706,076—Schuster
U.S. Pat. No. 3,714,402—Baumwolspiner
U.S. Pat. No. 3,829,798—Byram
U.S. Pat. No. 3,860,892—Speiser
U.S. Pat. No. 3,906,400—Gooding
U.S. Pat. No. 3,914,588—Nussbaumer
U.S. Pat. No. 3,979,701—Tomozawa
U.S. Pat. No. 4,016,410—Eggermont
U.S. Pat. No. 4,034,196—Butterweck
U.S. Pat. No. 4,034,197—Lawrence
U.S. Pat. No. 4,038,536—Feintuch
U.S. Pat. No. 4,049,958—Hartmann
U.S. Pat. No. 4,053,750—Constant
U.S. Pat. No. 4,075,764—Krogmann
U.S. Pat. No. 4,099,245—Maysonett
U.S. Pat. No. 4,104,729—Gingell
U.S. Pat. No. 4,149,258—Yahata Among those patents, significant differences and deficiencies exist which are pertinent in the context of the present invention.

For example, the patent to Tomozawa, U.S. Pat. No. 3,979,701 while directed to a non-recursive digital filter specifies that the filter is directed toward video processing utilized for low pass and band reject. That patent shows that changes in transfer functions are accomplished by adding cascaded sections. Although the filters do not utilize multipliers, it is not directed to the stabilization of second order servo mechanism.

The patent to Morrow, U.S. Pat. No. 3,665,171 is directed to a non-recursive digital filter used in signal processing which no attempt is made to eliminate multipliers. Also, no attempt is made in this patent to require that coefficients be in powers of two so that adding and shifting instructions can be used to implement the filter.

The same comments are generally pertinent with respect to the references to Nussbaumer, U.S. Pat. No. 3,914,588 in the sense that there is no attempt to force the coefficients to powers of two and as shown the multipliers are replaced by a read only memory. Moreover, in Nussbaumer input squared values are required.

The patent to Constant, U.S. Pat. No. 4,053,750 again does not attempt to reduce or eliminate the multiplications which are required in the filter implementation. Reference utilizes a feed forward filter, with zeros and poles, with an impulse response g, and computes the function $y = g*x$, that is, the convolution between the input signal x and the impulse transfer function g.

Finally, the patent to Gooding, U.S. Pat. No. 3,906,400 again makes no attempt to reduce the required multiplication which utilizes a significant number of addition operations. In order to achieve the required accuracy, a large number of states are involved since 1-bit coeff Accordingly, given the deficiencies of the prior art the present invention seeks to eliminate multiplication instructions, and minimize the number of additions in the filter operation. The present invention is directed to stabilization of a second order servo mechanism in which a systematic technique of stabilization is delineated. The required gain and phase characteristics are achieved with no multipliers and only two additions are required.

Accordingly, it is an object of this invention to define an improved digital filter which does not require multiply instructions.

A further object of this invention is to define a digital filter in which only add instructions, two left shift operations and two store instructions are utilized for the realization of the digital filters for a servo loop.

A further object of this invention is to define a digital filter wherein no multiply instructions are required and scalar multiplier constants are binary.

Still another object of this invention is to define a digital filter wherein scalar multiplier constants are binary and are performed effectively by left or right shift operations in an accumulator to thereby eliminate multiply instructions.

A still further object of this invention is to define an improved digital filter for use in a space navigation device wherein the total computation time is reduced and significant cost reductions occur.

These and other objects of this invention are achieved by a ditial filter represented by the second backward difference equation:

$$\nabla^2 C(n) = r(n) + k_1(r(n) - r(n-1)) + k_2((r(n) - r(n-1)) - (r(n-1) - r(n-2)))$$

where
- $k_1$ and $k_2$ are binary scalars and,
- $r(n)$ = latest input sampled value
- $r(n-1)$ = value at prior sample interval
- $r(n-2)$ = value at second prior sample interval The resulting filter utilizes two add instructions, two left shift and two store instructions to define the six machine operations necessary to realize the filter operation.

This invention will be described in greater detail with reference to the accompanying drawings and the description of the preferred embodiment which follows.

DESCRIPTION OF THE PREFERRED EMBODIMENT

In defining digital filters by the application of pulse filter theory and utilization of the Z transform to determine the required compensating filter usually the by-linear transformation Z equals $1+w/1-w$ is utilized. In defining such filters, a standing requirement exists to eliminate machine operations where possible and to reduce the number of multipliers so that computation time and processor requirements are minimized.

Accordingly, it can be hypothesized that a digital filter implementation exists wherein no multiply instructions are required. In such a filter scalar multiplier constants are defined as binary elements and can be performed effectively by right or left shift operations in a suitable accumulator. Utilizing the second backward different equation, such a filter can be represented as follows:

$$\nabla^2 C(n) = r(n) + k_1(r(n) - r(n-1)) + k_2((r(n) - r(n-1)) - (r(n-1) - r(n-2)))$$

where:
- $k_1$ and $k_2$ are binary scalars and,
- $r(n)$ = latest input sampled value
- $r(n-1)$ = value at prior sample interval
- $r(n-2)$ = value at second prior sample interval If, $r(n)$ represents a positional error value between a desired value and an actual value, $k_2$ is a term proportional to acceleration within the servo loop. The term $k_1$ would then be proportional to rate in the sextant servo loop.

Accordingly, this filter can adequately stabilize a typical second order sampled data servo loop where $k_1$ and $k_2$ are binary scalars if the sample frequency is sufficiently high with respect to the desired closed looped bandwidth.

The filter characteristics can be investigated in the frequency domain utilizing the Z form wherein:

$$G(Z) = Z^{-2}(k_2) + Z^{-1}(-k_1 - 2k_2) + (1 + k_1 + k_2)$$

and, the transformation to the W plane via the bilinear transform:

$$Z = \frac{1+w}{1+w}$$

is accomplished. This yields, $$G(w) = \frac{\left(1 + \frac{w}{v_1}\right)\left(1 + \frac{w}{v_2}\right)}{(1+w)^2}$$

where $$v_1 = \frac{(k_1 + 1) + \sqrt{k_1^2 - 4k_2}}{4k_2 + 2k_1 + 1}$$

$$v_2 = \frac{(k_1 + 1) - \sqrt{k_1^2 - 4k_2}}{4k_2 + 2k_1 + 1}$$

The zeros, $v_1$ and $v_2$ of the filter in the dimensionless frequency plane, w, are functions of $k_1$ and $k_2$.

Figure 1:
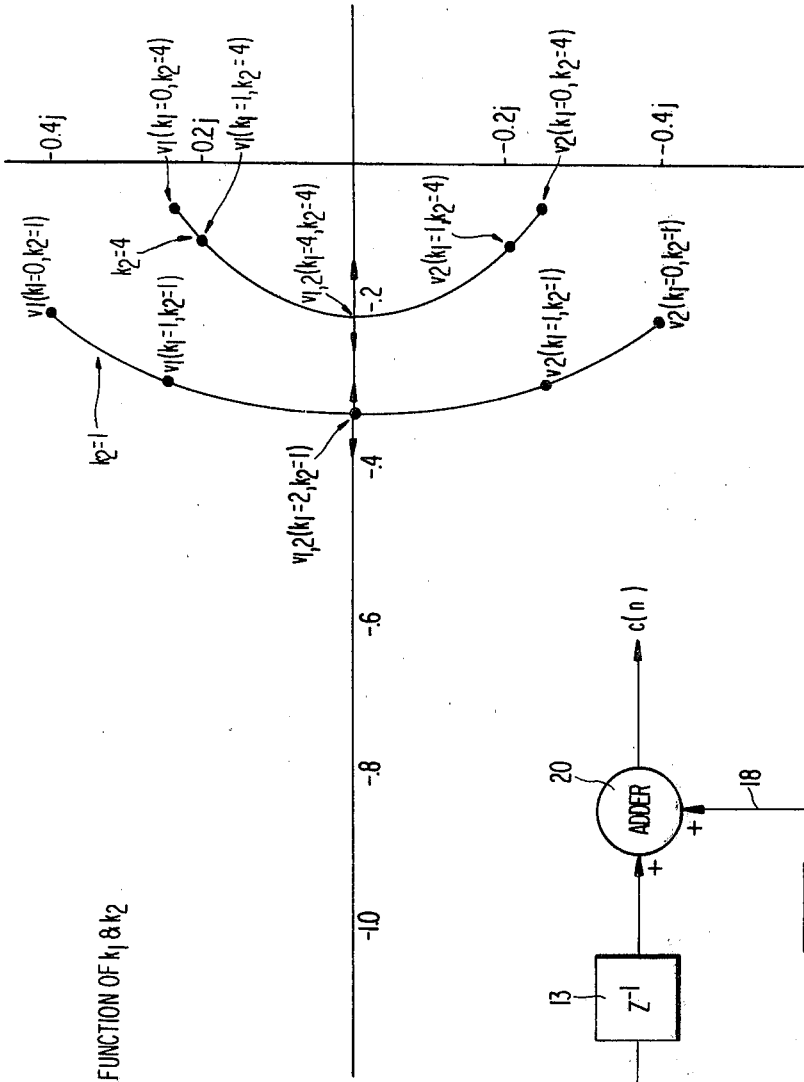
FIG. 1 is a plot showing zero locations $v_1$ and $v_2$ as a function of $k_1$ and $k_2$.

Referring now to FIG. 1 the zero locations as a function of $k_1$, for $k_2 = 1$ and 4 are depicted. For purpose of simplicity, $k_1$ and $k_2$ can be required to be binary scalars and $v_1$ and $v_2$ to be real to prevent filter peaking. Given those requirements, FIG. 1 shows that an appropriate crossing point occurs at $k_1$ equals 2 and $k_2$ equals 1 and yields the filter $$G(W) = \frac{\left(1 + \frac{w}{0.33}\right)^2}{(1+w)^2}$$

whose Z transform can be represented as:

$$G(Z) = 4(1 - z^{-1}) + Z^{-2}$$

Figure 2:
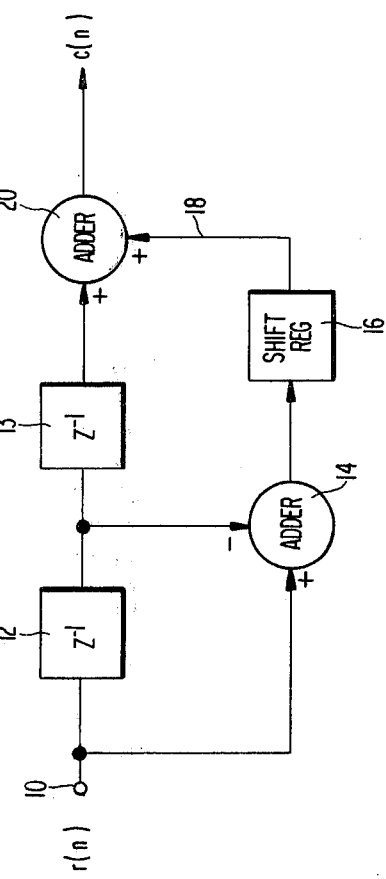
FIG. 2 is a schematic realization of the filter realized for particular values of $k_1$ and $k_2$.

Given this transform, a filter corresponding to the transform is shown in FIG. 2.

FIG. 2 shows an input $r(n)$ which is the latest input sample supplied at input 10. The sample is delivered to first delay element 12 coupled to a second delay element 13. These boxes marked $Z^{-1}$ are conventional delay elements such as shift registers or delay lines as is conventionally known and accepted in the art. For example, reference is made to U.S. Pat. No. 3,979,701 for conformation that such delay elements are well known. The sample $r(n)$ is also delivered to a first adder 14 which receives as a second quantity the delay output from element 12. The output of the adder 14 is supplied to the shift register 16. That shift register performs two left shift instructions and delivers the first output on line 18 to a second adder 20. The adder 20 performs a summing operation of the output of the shift register 16 and the second delay element 13 to deliver an output $C(n)$.

If the required frequency sample is $w_o$, and it is defined to be approximately 10 times the required closed loop bandwidth $^wBW$ then the open loop cross over frequency in the W plane can be derived from:

$$v = \tan \frac{\pi w}{w_o}$$

thereby yielding $$V_{OL} = \tan \frac{\pi w_{BW}}{w_o}$$

However, since, $$w_o = 10 w_{BW}$$

therefore $$v_{OL} = \tan \frac{\pi w_{BW}}{10 w_{BW}} = 0.32.$$

Given the value found in the above equation for the unity gain cross over, the filter shown in FIG. 2 provides 53.5 degrees of phase lead at $V_{OL}$ with a minimal modification of the gain curve below $v_{OL}$.

In the case of typical second order servo systems, the mecanical break frequency is considerably below the closed loop bandwidth. Accordingly a lead of 53.5 degrees provided by such a filter at the unity gain cross over would produce a phase margin of:

$$\phi_{PM} = 30° \text{ to } 40°,$$

resulting in minimal degradation in loop compliance.

EXAMPLE

As indicated herein, the filter in accordance with this invention can be utilized in a space navigation system as defined in U.S. Pat. Nos. 4,082,462 and 4,083,636. In such a system, the servo loops are position loops that close directly to telescopic detectors when an image of the tracking target occurs. The principal servo requirement in that context can be summarized as, first, a position loop type servo with proportional plus integral paths. The phase margin should be no less than 30° and compliance greater than 0.5 in oz/arc. sec. The bandwidth should be at least 16 hz with a sample frequency in the order of 167 hz. The servo activity at null should be less than 1 arc. sec.

In the configuration of a telescope servo utilizing the compensation filter shown in FIG. 2 the resulting performance parameters would be
  phase margin—36°
  compliance—0.93 in oz/arc. sec.
  bandwidth—16 hz
  sample frequency 167 hz A computer simulation with the design loop to investigate acquisition, stability and servo activity at null with 0.5 in. oz. gimbal friction and utilizing a 15/1 detection signal to noise ratio resulted in a trajectory indicating positive performance. In this test, the target entered the field of view, acquisition was positive and the resulting servo noise 1 sigma value did not exceed 0.5 arc. sec.

It is apparent that other than the example, that is, using the invention in a space sextant telescope servo loop, it also finds utility in other systems wherein the real time requirements of the computational subsystems are materially reduced.

We claim:

1. A second order digital filter comprising:
   a first delay element receiving an input signal r(n);
   a first summing means receiving the signal r(n) and the output of said first delay element, and producing a summed output;
   shift register means receiving the output of said first summing means and shifting the summed output a predetermined number of places;
   a second delay element coupled to said first delay element, and;
   a second summing means receiving the outputs from said shift register and said second delay element and producing a compensated output c(n), where $\nabla^2 c(n) = r(n) + k_1(r(n) - r(n-1)) + k_2((r(n) - r(n-1)) - (r(n-1) - r(n-2))$, wherein: $k_1$ and $k_2$ are binary scalars, r(n) is the latest input sample, r(n−1) is the prior sample, r(n−2) is the second prior sample.

2. The digital filter of claim 1 wherein said shift register is a two place left shift register.

3. The digital filter of claim 1 wherein the transfer function in Z for said filter is $$G(Z) = Z^{-2}(k_2) + Z^{-1}(-k_1 - 2k_2) + (1 + k_1 + k_2).$$

4. The digital filter of claim 1 wherein said filter has a function in the dimensionless frequency plane w of:

$$G(W) = \frac{\left(1 + \frac{w}{0.33}\right)^2}{(1 + w)^2}$$

5. The digital filter of claim 4 wherein the Z transform is:

$$G(Z) = 4(1 - Z^{-1}) + Z^{-2}.$$

* * * * *